(12) United States Patent
Geetla et al.

(10) Patent No.: US 11,784,651 B2
(45) Date of Patent: Oct. 10, 2023

(54) CIRCUITRY AND METHODS FOR FRACTIONAL DIVISION OF HIGH-FREQUENCY CLOCK SIGNALS

(71) Applicant: NXP B.V., Eindhoven (NL)

(72) Inventors: Ravichandar Reddy Geetla, Austin, TX (US); Deependra Kumar Jain, Noida (IN); Gaurav Agrawal, Aligarh (IN); Ravi Kumar, Noida (IN)

(73) Assignee: NXP B.V., Eindhoven (NL)

( * ) Notice: Subject to any disclaimer, the term of this patent is extended or adjusted under 35 U.S.C. 154(b) by 135 days.

(21) Appl. No.: 17/512,231

(22) Filed: Oct. 27, 2021

(65) Prior Publication Data

US 2023/0126891 A1 Apr. 27, 2023

(51) Int. Cl.
*H03L 7/099* (2006.01)
*H03L 7/081* (2006.01)
*H03L 7/197* (2006.01)
*H03M 3/00* (2006.01)

(52) U.S. Cl.
CPC .......... *H03L 7/0992* (2013.01); *H03L 7/0814* (2013.01); *H03L 7/0995* (2013.01); *H03L 7/1974* (2013.01); *H03M 3/30* (2013.01)

(58) Field of Classification Search
CPC ... H03L 7/0995; H03L 7/0992; H03L 7/0814; H03L 7/1974; H03L 7/081; H03L 7/0996; H03L 7/1976; H03M 3/30
See application file for complete search history.

(56) References Cited

U.S. PATENT DOCUMENTS

| | | | | |
|---|---|---|---|---|
| 4,739,191 A | * | 4/1988 | Puar | G05F 3/205 327/536 |
| 5,889,436 A | * | 3/1999 | Yeung | H03L 7/081 331/25 |
| 6,018,253 A | * | 1/2000 | Wendell | G11C 8/14 326/119 |
| 6,088,255 A | * | 7/2000 | Matsuzaki | H03L 7/0814 365/194 |
| 6,229,363 B1 | * | 5/2001 | Eto | G11C 7/22 327/158 |

(Continued)

FOREIGN PATENT DOCUMENTS

| | | | | |
|---|---|---|---|---|
| CN | 1460204 A | * | 12/2003 | G06F 1/04 |
| CN | 1213355 C | * | 8/2005 | G06F 1/04 |

(Continued)

*Primary Examiner* — Berhanu Tadese

(57) ABSTRACT

An oscillator provides a plurality of clock signals, including a first clock signal having a first frequency and a first period, wherein each clock signal has the first frequency and is phase shifted from the first clock signal by an integer times a predetermined fractional amount of the first period. A multiphase frequency divider receives the plurality of clock signals and provides a divided clock output, and includes an integer frequency divider which provides the divided clock output based on a modified clock input and a clock selector which provides a current clock as the modified clock input during a first portion of the divided clock output and a next clock as the modified clock input during a subsequent portion of the divided clock output. The next clock is selected from the plurality of clock signals based on a selected fractional phase shift amount indicated by a sigma-delta modulator.

16 Claims, 6 Drawing Sheets

(56) References Cited

U.S. PATENT DOCUMENTS

| | | | | |
|---|---|---|---|---|
| 6,329,860 B1* | 12/2001 | Komatsu | H03K 3/0322 | 327/105 |
| 6,441,660 B1* | 8/2002 | Ingino, Jr. | H03L 7/0995 | 327/159 |
| 6,483,358 B2* | 11/2002 | Ingino, Jr. | H03L 7/0995 | 327/148 |
| 6,566,970 B2* | 5/2003 | Ingino, Jr. | H03L 7/0896 | 331/34 |
| 6,597,217 B2* | 7/2003 | Ingino, Jr. | H03L 7/0995 | 327/148 |
| 6,621,675 B2* | 9/2003 | Ingino, Jr. | G05F 1/575 | 361/91.1 |
| 6,724,228 B2* | 4/2004 | Kashiwazaki | H03L 7/0814 | 327/158 |
| 6,747,497 B2* | 6/2004 | Ingino, Jr. | H03K 3/0315 | 327/159 |
| 6,842,079 B2* | 1/2005 | Ingino, Jr. | H03L 7/0995 | 331/34 |
| 6,914,476 B2* | 7/2005 | Ingino, Jr. | H03K 3/0315 | 327/143 |
| 7,071,787 B2* | 7/2006 | Knierim | H03M 7/3006 | 375/376 |
| 7,072,633 B2* | 7/2006 | Gomez | H03L 7/185 | 455/260 |
| 7,075,384 B2* | 7/2006 | Tamura | H03L 7/1976 | 332/127 |
| 7,132,880 B2* | 11/2006 | Ingino, Jr. | H03L 7/0995 | 327/541 |
| 7,349,271 B2* | 3/2008 | Kuang | G11C 29/50012 | 365/201 |
| 7,365,580 B2 | 4/2008 | Martin et al. | | |
| 7,376,001 B2* | 5/2008 | Joshi | G11C 29/50012 | 365/156 |
| 7,483,322 B2* | 1/2009 | Joshi | G11C 29/50 | 365/201 |
| 7,496,168 B2 | 2/2009 | Leonowich et al. | | |
| 7,583,152 B2* | 9/2009 | Zhang | H03L 7/093 | 331/25 |
| 7,629,819 B2* | 12/2009 | Kwak | H03L 7/0814 | 327/158 |
| 7,728,631 B2* | 6/2010 | Nathawad | H03L 7/0891 | 327/12 |
| 8,072,253 B2* | 12/2011 | Kaeriyama | H03L 7/0998 | 327/231 |
| 8,093,937 B2* | 1/2012 | Kwak | H03L 7/0818 | 327/271 |
| 8,421,515 B2* | 4/2013 | Kwak | H03L 7/00 | 327/277 |
| 8,664,988 B1 | 3/2014 | Xiu | | |
| 8,878,586 B2* | 11/2014 | Kwak | H03L 7/00 | 327/158 |
| 9,094,023 B2* | 7/2015 | Shin | H03L 7/18 | |
| 10,158,366 B2* | 12/2018 | Galton | H03L 7/193 | |
| 10,177,772 B2* | 1/2019 | Zhuang | H03L 7/0898 | |
| 10,291,239 B1* | 5/2019 | Wu | H03L 7/1974 | |
| 10,348,275 B2* | 7/2019 | San Martin Molina | H03K 23/54 | |
| 10,425,091 B2* | 9/2019 | Jain | H03L 7/1976 | |
| 10,965,297 B1* | 3/2021 | Wu | H03L 7/0805 | |
| 11,152,947 B2* | 10/2021 | Chu | H03L 7/18 | |
| 11,296,860 B2* | 4/2022 | Sridharan | H04L 7/0337 | |
| 2005/0218996 A1* | 10/2005 | Tamura | H03L 7/1976 | 331/1 A |
| 2005/0285685 A1* | 12/2005 | Frey | H03L 7/0891 | 331/16 |
| 2006/0164132 A1* | 7/2006 | Martin | H03L 7/081 | 327/105 |
| 2007/0018701 A1* | 1/2007 | Abbasi | H03L 7/1072 | 327/157 |
| 2007/0139088 A1* | 6/2007 | Garlapati | H03K 21/10 | 327/115 |
| 2007/0152763 A1* | 7/2007 | Mansuri | H03K 3/0322 | 331/57 |
| 2007/0164829 A1* | 7/2007 | Ko | H03L 7/093 | 331/17 |
| 2007/0182611 A1* | 8/2007 | Yu | H03M 7/3006 | 341/143 |
| 2008/0258942 A1* | 10/2008 | Gschier | H03L 7/1976 | 327/158 |
| 2009/0085630 A1* | 4/2009 | Haralabidis | G06F 1/08 | 327/299 |
| 2011/0037523 A1* | 2/2011 | Roine | H03L 7/0895 | 331/10 |
| 2014/0003570 A1* | 1/2014 | Terrovitis | H03L 7/1976 | 377/47 |
| 2014/0070857 A1* | 3/2014 | Huang | H03L 7/1976 | 327/156 |
| 2015/0145571 A1* | 5/2015 | Perrott | G04F 10/005 | 327/551 |
| 2015/0200676 A1* | 7/2015 | Ainspan | H03L 7/099 | 327/159 |
| 2015/0381191 A1* | 12/2015 | Wu | H03L 7/0996 | 331/1 R |
| 2016/0079989 A1* | 3/2016 | Ainspan | H03L 7/0992 | 327/156 |
| 2016/0294541 A1* | 10/2016 | van de Beek | H03L 7/0992 | |
| 2017/0244544 A1* | 8/2017 | Galton | H03L 7/193 | |
| 2019/0036514 A1* | 1/2019 | San Martin Molina | H03L 7/1974 | |
| 2020/0266823 A1* | 8/2020 | Chu | H04J 3/0688 | |
| 2022/0270938 A1* | 8/2022 | Marimuthu | G01R 31/2856 | |
| 2022/0303112 A1* | 9/2022 | Sridharan | H03L 7/1976 | |
| 2023/0096760 A1* | 3/2023 | Bowman | H03L 7/0814 | 327/175 |
| 2023/0126891 A1* | 4/2023 | Geetla | H03L 7/0992 | 375/376 |

FOREIGN PATENT DOCUMENTS

| | | | | |
|---|---|---|---|---|
| CN | 101997629 A | * | 3/2011 | H03L 7/07 |
| CN | 111600601 A | * | 8/2020 | H03L 7/07 |
| DE | 60213691 T2 | * | 10/2007 | G05F 1/575 |
| DE | 60217739 T2 | * | 11/2007 | H03K 17/223 |
| DE | 60219225 T2 | * | 1/2008 | H03K 17/223 |
| DE | 102011053121 A1 | * | 2/2013 | H03L 7/1976 |
| DE | 102014222133 A1 | * | 4/2015 | H03K 3/011 |
| DE | 102014222133 B4 | * | 2/2020 | H03K 3/011 |
| EP | 1229419 A2 | * | 8/2002 | G05F 1/575 |
| EP | 1229654 A2 | * | 8/2002 | H03K 17/223 |
| EP | 1229656 A2 | * | 8/2002 | G05F 1/575 |
| EP | 1229658 A2 | * | 8/2002 | H03K 17/223 |
| EP | 1229656 B1 | * | 8/2006 | G05F 1/575 |
| EP | 1229658 B1 | * | 1/2007 | H03K 17/223 |
| EP | 1229654 B1 | * | 4/2007 | G05F 1/575 |
| EP | 1712049 B1 | * | 6/2010 | H03C 3/0925 |
| EP | 1367709 B1 | * | 5/2011 | H03D 7/161 |
| EP | 1969725 B1 | * | 9/2012 | G06F 1/022 |
| EP | 3700091 A1 | * | 8/2020 | H03L 7/07 |
| EP | 4175180 A1 | * | 5/2023 | H03L 7/0814 |
| GB | 2564915 A | * | 1/2019 | G04G 3/02 |
| TW | 201138318 A | * | 11/2011 | H03L 7/07 |
| WO | WO-2012093424 A1 | * | 7/2012 | H03L 7/1976 |
| WO | WO-2018013406 A1 | * | 1/2018 | H03L 7/087 |

\* cited by examiner

CIRCUITRY AND METHODS FOR FRACTIONAL DIVISION OF HIGH-FREQUENCY CLOCK SIGNALS

BACKGROUND

Field

This disclosure relates generally to generating clock signals for integrated circuits, and more specifically, to circuitry and methods for fractional division of high-frequency clock signals.

Related Art

Phase-locked loop (PLL) circuits are frequently used in devices such as radio, telecommunications, computers and other electronic applications to provide an accurate clock signal to components that operate at a specified frequency. In some systems, there may be components that operate at different frequencies. Instead of duplicating the clock circuitry for each frequency, the clock signal from one set of clock circuitry can be multiplied or divided to provide signals at the multiple required frequencies ranging from a fraction of a hertz up to many gigahertz. For this reason, clock circuitry can also be referred to as frequency synthesizer circuitry.

Delta-sigma fractional-N phase locked loops (PLLs) are not limited to integer multiples of a reference frequency. The core of a delta-sigma fractional-N PLL is similar to an integer-N PLL, but incorporates additional digital circuitry to accurately interpolate between integer multiples of the reference frequency. A single delta-sigma fractional-N PLL often can be used for local oscillator generation in applications that would otherwise require a cascade of two or more integer-N PLLs.

Fractional frequency synthesizers can have an inherent performance limitation due to the use of a fractional (i.e. non-integer) multiplication factor between an output clock and an input clock. This performance limitation exists in addition to all other error terms that may be present in integer-N clock generators/multipliers. In particular, the clock edges may deviate from the timing of an ideal periodic clock signal, a phenomenon commonly referred to as clock jitter. Jitter reduces the timing precision and, hence, signal quality. Moreover, since the output clock of a frequency synthesizer is often sent to many components in a system, any jitter present in the frequency synthesizer's output clock can propagate throughout the multiple components resulting in a degradation of performance, and possibly even failure, across larger systems.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of frequency synthesizer circuitry and methods for fractional division of high-frequency clock signals are disclosed that use an oscillator to provide clock signals having a first frequency and a first period, and are phase shifted by an integer times a predetermined fractional amount of the first period. A multiphase frequency divider receives the plurality of clock signals and provides a divided clock output, and includes an integer frequency divider which provides the divided clock output based on a modified clock input and a clock selector. A subsequent clock signal is selected from the oscillator based on a selected fractional phase shift amount indicated by a sigma-delta modulator, thus reducing quantization noise due to sigma-delta modulator by a factor of the number of phases. The bandwidth of phase-locked loop can be increased to reduce the effect of oscillator noise at the PLL output. The frequency synthesizer circuitry can be used for both analog and digital phase-locked loops.

Figure 1:
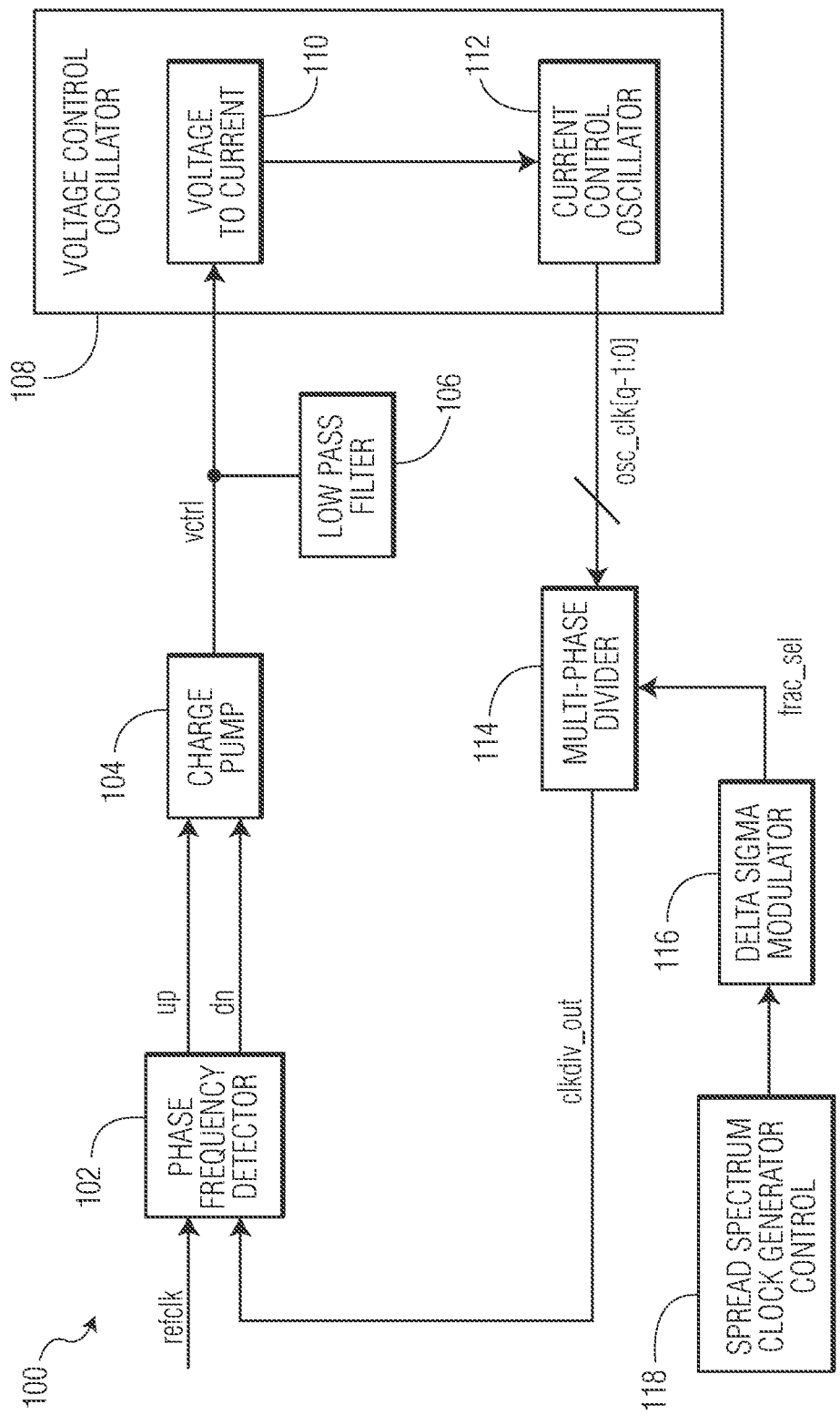
FIG. 1 illustrates a block diagram of components of a frequency synthesizer circuit with a multiphase divider circuit in accordance with selected embodiments of the invention.

A FIG. 1 illustrates a block diagram of components of frequency synthesizer circuit 100 with phase frequency detector (PFD) circuit 102, charge pump 104, low-pass filter 106, voltage controlled oscillator 108 that includes voltage to current converter 110 and current control oscillator 112, multiphase divider circuit 114, Delta Sigma modulator 116, and spread spectrum clock generator control circuit 118 in accordance with selected embodiments of the invention. PFD circuit 102 has a first input coupled to output of multiphase divider circuit 114, a second input coupled to a reference clock signal, a first output coupled to provide an up signal to charge pump 104 and a second output coupled to provide a down signal to charge pump 104. The output of multiphase divider circuit 114 is a divided clock out signal CLKDIV_OUT. Charge pump 104 produces a voltage control signal VCTRL that is provided as input to voltage to current converter 110. Low-pass filter 106 is coupled the output of charge pump 104. Voltage to current converter 110 provides a current signal to current control oscillator 112. Current control oscillator 112 provides one or more oscillator clock signals to multiphase divider circuit 114. Spread spectrum clock generator control circuit 118 is coupled to provide an output to Delta Sigma modulator 116. Delta Sigma modulator 116 provides a fraction select signal FRAC_SEL to an input of multiphase divider circuit 114. The fractional select signal FRAC_SEL indicates an amount of phase shift required for the next fractional phase.

Phase frequency detector (PFD) circuit 102 compares the divided clock out signal CLKDIV_OUT from multiphase divider circuit 114 with a reference clock signal to produce control signals UP or DOWN that are proportional to the phase difference between the input divided clock out signal CLKDIV_OUT and the reference clock signal.

Charge pump 104 supplies charge amounts in proportion to the phase error detected. The UP and DOWN control pulses cause charge pump 104 to produce no net change VCTRL when the phase is perfectly matched. When UP is high and DOWN is low then current flows out of charge pump 104 and into low pass filter 106. When UP is low and DOWN is high then current flows out of low pass filter 106 and into charge pump 104.

Low-pass filter 106 extracts the low frequency content of the control voltage signal VCTRL of the output of charge pump 104, which is fed to a voltage-controlled oscillator (VCO) 108. Low-pass filter 106 can be especially useful to remove ripple in the signal from charge pump 104 when switching from ON to OFF and vice versa. In some embodiments, low pass filter 106 can include one resistor and two capacitors, with the resistor and one capacitor coupled in series between the output of charge pump 104 and ground, and the second capacitor coupled between the input of to VCO 108 and ground. Other low pass filter topologies can be used, however.

Voltage controlled oscillator 108 includes voltage to current converter 110 and current control oscillator 112. Voltage to current converter 110 converts the filtered voltage control signal to a bias current proportional to the filtered voltage control signal. Current controlled oscillator 112 receives the bias current output by voltage to current converter 110 and produces clock phase signals at different phases. The clock phase signals are used by multiphase divider circuit 114 to produce feedback to PFD circuit 102 in the form of divided clock out signal CLKDIV_OUT.

Figure 2:
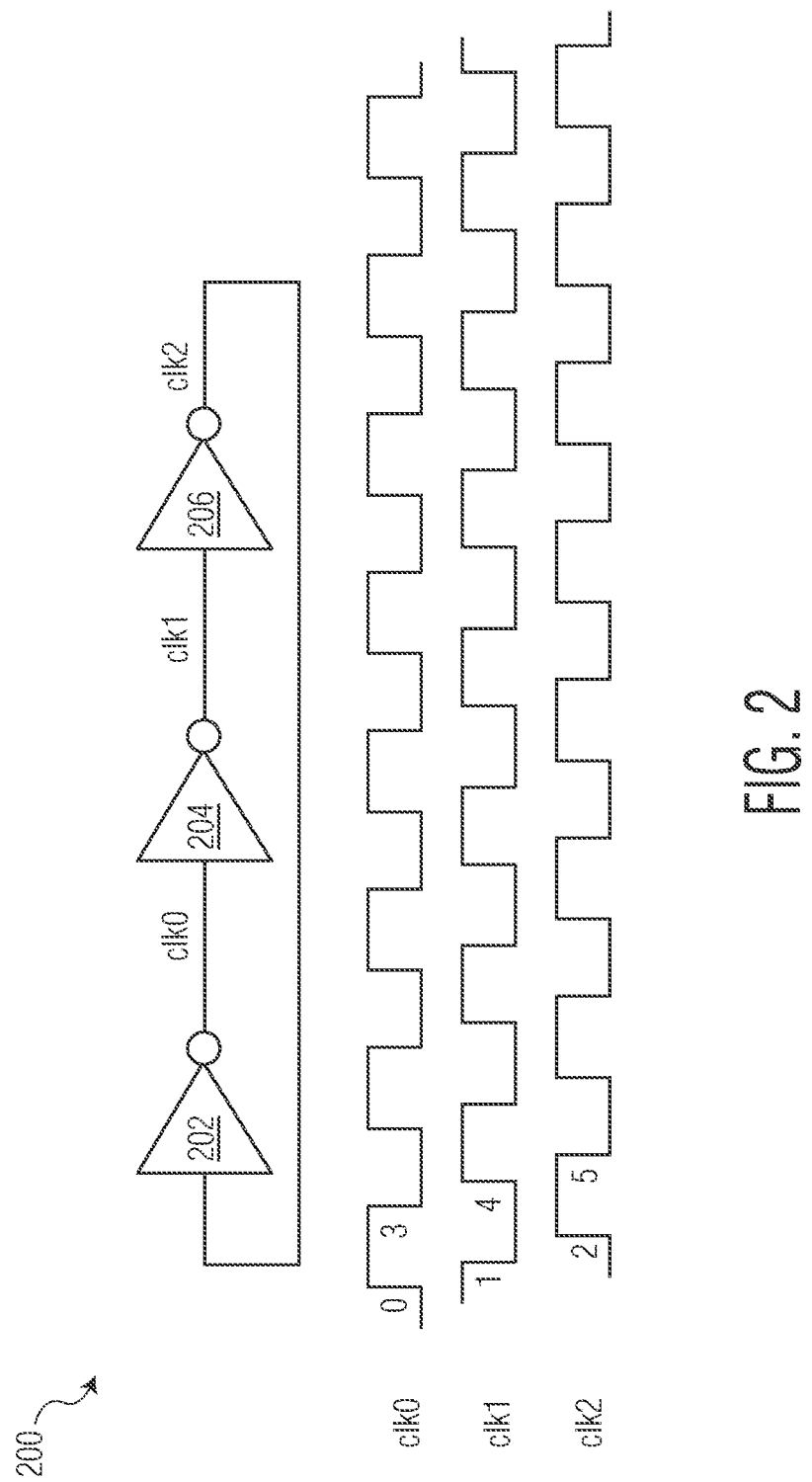
FIG. 2 illustrates a schematic diagram of circuitry for generating staggered clock signals that can be used in the frequency synthesizer circuit of FIG. 1 in accordance with selected embodiments of the invention.

Current controlled oscillator 112 may be implemented as a ring oscillator as shown in FIG. 2. Ring oscillator 200 can include a series of N connected delay cells 202-206 with the input of the last cell 206 being fed back to the input of the first cell 202. Delay cells 202-206 can be implemented using inverters or other suitable components. In the example shown, three delay cells 202, 204, 206 each generate a clock signal, with rising and falling edges that can be used multiphase divider circuit 114, as further explained in the description of FIG. 3 herein. Each clock signal has the same frequency and is phase shifted from the first clock signal by a predetermined fractional amount of the clock period. The predetermined fractional amount can be between zero and one. As an example, for three delay cells 202, 204, 206, the total number of clock signals is 6, with a phase shift equal to one-sixth of the clock period for the three clock signals and their complements. The leading and trailing edges of initial clock signal CLK0 are used for the first and fourth clock signals. The leading and trailing edges of second clock signal CLK1 are used for second and fifth clock signals. The leading and trailing edges of third clock signal CLK2 are used for third and sixth clock signals. The phase of second clock signal CLK1 is shifted ⅓ of half of the clock period from the first clock signal CLK0. The phase of third clock signal CLK2 is shifted ⅔ of half the clock period from the first clock signal CLK0. Note that, the number of delay cells can be increased or decreased in current controlled oscillator 112, depending on the number and frequencies of fractional clock signals to be generated. Ring oscillator 200 can include N inverters, in which N is an odd number greater than or equal to three, and the plurality of clock signals includes 2*N clock signals, where N is an odd integer. The selected fractional phase shift amount can be between zero and one, and corresponds to a selected integer times the predetermined fractional amount of the first period.

Figure 3:
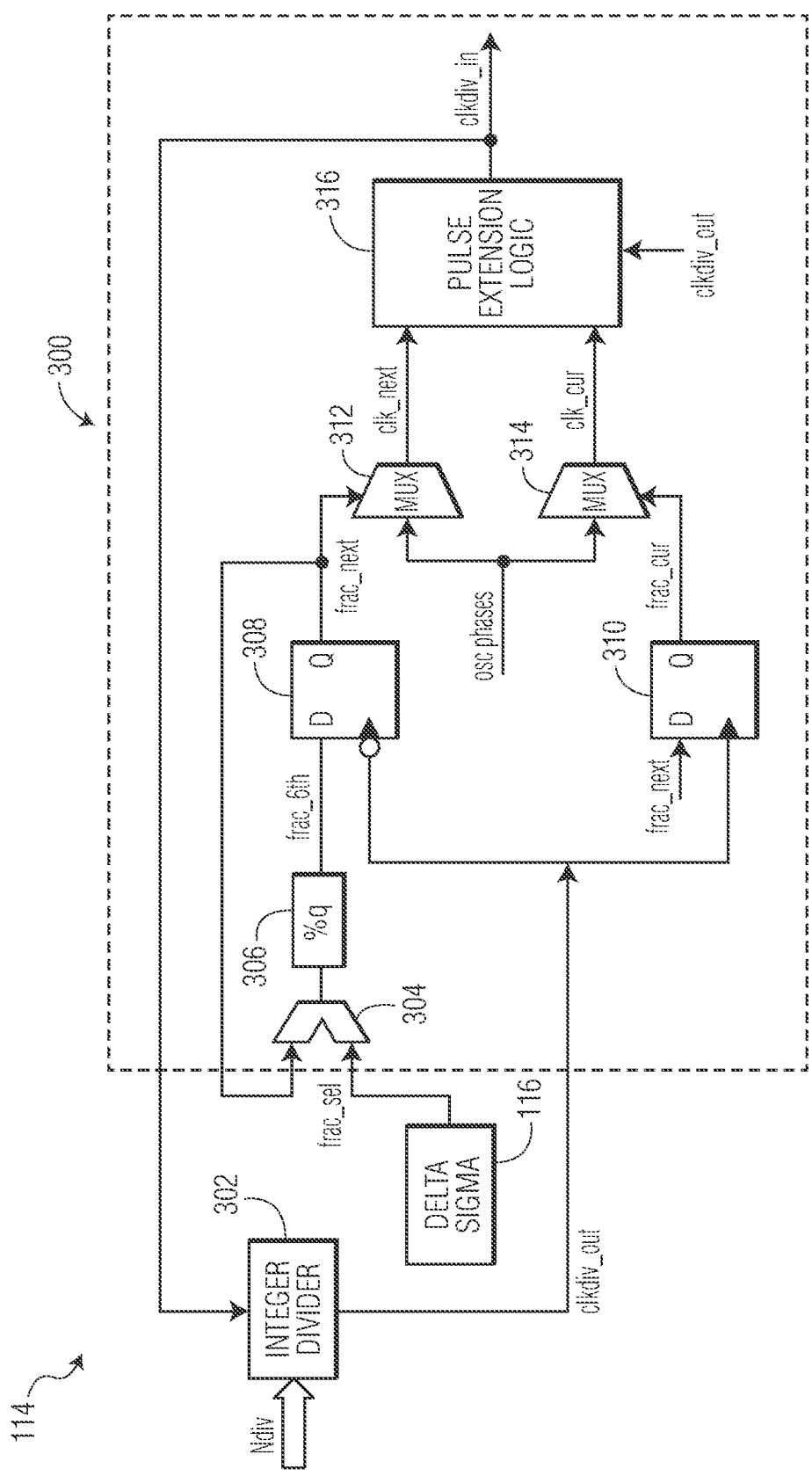
FIG. 3 illustrates a block diagram of a top level the multiphase divider circuit that can be used in the frequency synthesizer circuit of FIG. 1 in accordance with selected embodiments of the invention.

Frequency synthesizer circuit 100 can produce both integer and fractional multiples of a reference frequency. FIG. 3 illustrates a schematic diagram of multiphase divider circuit 114 with clock selection circuitry 300 that can be used in frequency synthesizer circuit 100 of FIG. 1 in accordance with selected embodiments of the invention. Multiphase divider circuit 114 includes integer divider circuit 302, accumulator 304, modulo circuit 306, flip flop circuits 308, 310, multiplexers 312, 314, and pulse extension logic 316. Integer divider circuit 302 receives an integer divider number NDIV that indicates an integer portion of clock signals to be divided to use in multiphase divider circuit 114. The number of clock signals can be determined by dividing the frequency of the voltage controlled oscillator 108 by the frequency of the reference clock. Integer divider circuit 300 provides a divided clock out signal CLKDIV_OUT to delta sigma modulator 116 and to respective clock inputs of flip flop storage circuits 308, 310. Integer divider circuit 304 can be implemented using a pulse-swallow divider circuit, a multi-modulus divider circuit, or other suitable divider circuit that uses a programmable divide range. The programmable divide number NDIV may be initialized during startup or reset or other suitable time using software and a value provided by a user, or preprogrammed in firmware or hardware.

Delta Sigma modulator 116 receives a fractional divider number FRAC_DIV having a value between 0 and 1 that may be initialized through software or firmware or other suitable means to indicate a fractional remainder portion of the frequency of the voltage controlled oscillator 108 divided by the frequency of the reference clock. Delta Sigma modulator 116 provides fractional phase select signal FRAC_SEL to a first input of accumulator 304. The fractional phase select signal FRAC_SEL indicates which fractional phase of the clock signals is selected. Accumulator 304 receives a second input from an output of flip flop circuit 308, which is a next fractional phase signal FRAC_NEXT to use. Accumulator 304 provides an input to modulo circuit 306. Modulo circuit 306 divides the output of accumulator 304 by the total number of possible clock signals, in this case, the number 6. The remainder is used to determine the next clock signal to be used. Systems that use a different number of fractional clock signals will use the number of possible fractional clock signals as a divisor in modulo circuit 306.

The output of modulo circuit 306 is provided to a data input of flip flop storage circuit 308. Flip flop storage circuit 308 outputs the next fractional phase FRAC_NEXT to a control input to multiplexer 312, a data input to flip flop storage circuit 310, and as feed back to the second input of accumulator 304. Flop storage circuit 310 outputs a current fractional phase signal FRAC_CUR that indicates the current phase being used as a control input to multiplexer 314.

Multiplexers 312, 314 receive the clock signals CLK0, CLK1, CLK2, CLK0B, CLK1B, CLK2B. Multiplexer 312 outputs a next clock signal CLK_NEXT to pulse extension logic 316, using the fractional next signal to select which of the oscillator clock signals to choose next. Multiplexer 314 outputs a current clock signal CLK_CUR to pulse extension logic 316, using the current fractional phase signal FRAC_CUR to select which phase to choose for the current phase. The divided clock out signal CLKDIV_OUT is also provided as an input to pulse extension logic 316. A modified clock in signal CLKDIV_IN is output by pulse extension logic 316 and provided as an input to integer divider circuit 300.

In multiphase divider circuit 114, the current phase and next phase can be pre-determined well before switching time. Different phases of the current control oscillator clock can be used for fractions less than or equal to 0.5 and for fractions greater than 0.5. A half-cycle period of the current control oscillator clock signal can be used to extend a pulse as required to enable fractional division on very high frequency clocks, up to, for example, 10 GHz in 5 nm gate technology, to help smooth switching between phases. Flexible quantized fractions are possible up to a resolution of 1/(2N), where N is the number of stages in the ring. Without any modulation from the delta sigma modulator, the final output CLKDIV_OUT is Ndiv+(k/(2N)), where Ndiv is an integer divider and k=0, 1, 2, . . . 2N−1. Any number of equidistant phase fractions can be chosen from 2N phases by varying k.

Referring again to FIG. 1, delta sigma modulator 116 performs fractional division on clock signals from current control oscillator 112, which are not limited to integer values for phase values, that is, the selected phase can be a fraction between integer numbers. The output of delta sigma modulator 116 is a signal that indicates the phase selected, represented by fractional phase select signal FRAC_SEL in FIG. 1. Any suitable delta signal modulator architecture can be used. For example, delta sigma modulator 116 can use coarse uniform quantizers to perform the quantization with feedback around the quantizers to suppress the quantization noise.

Spread spectrum clock generator control circuit 118 can provide a pseudo-random bit sequence as input to delta sigma modulator 116 using spread spectrum capability to modulate the output clock frequency over a small range, spreading the energy and reducing the energy peak. By reducing peak energy, electromagnetic interference may be reduced, which could otherwise affect operation of circuitry internal and external to frequency synthesizer circuit 100.

Figure 4:
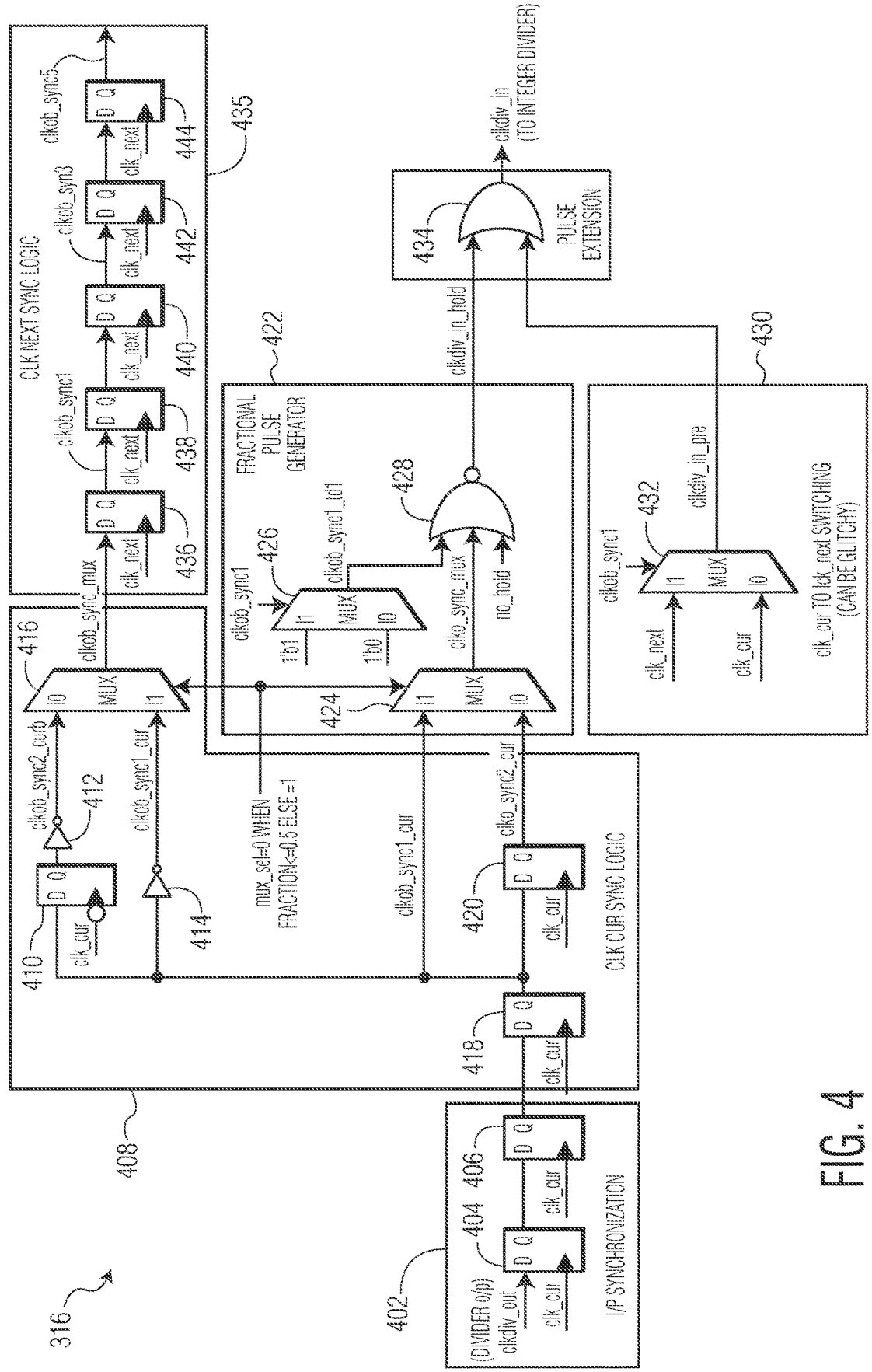
FIG. 4 illustrates a block diagram of a pulse extension logic circuit that can be used in the multiphase divider circuit of FIG. 3 in accordance with selected embodiments of the invention.

Referring to FIGS. 3 and 4, FIG. 4 illustrates a schematic diagram of pulse extension logic circuitry 316 that can be used in the multiphase divider circuit of FIG. 3 in accordance with selected embodiments of the invention including input clock (CLKDIV_OUT) synchronization circuitry 402, current clock synchronization circuitry 408, next clock synchronization logic 435, fractional pulse generator 422, current clock to next clock switching circuitry 430, and pulse extension circuitry 434. Pulse extension logic circuitry 316 synchronizes signals used in multiphase divider circuit 114 to achieve the selected clock phase, and to extend a clock pulse to achieve a smooth transition when the selected phase changes.

I/P synchronization circuit 402 includes a first flip flop circuit 404 with a data input receiving the clock divider output signal CLKDIV_OUT, a clock input that receives the current clock signal CLK_CUR, and an output that is coupled to a data input of flip flop circuit 406. Flip flop circuit 406 further includes a clock input that receives the current clock signal CLK_CUR, and an output that is coupled to a data input of flip flop circuit 418 in current clock synchronization circuitry 408.

In current clock synchronization circuitry 408, flip flop circuit 418 further includes a clock input that receives the current clock signal CLK_CUR, and an output that is coupled to a data input of flip flop circuits 410 and 420. Flip flop circuit 410 further includes a clock input that receives the current clock signal CLK_CUR, and an output coupled to input of inverter 412. The output of inverter 412 is provided as a first input to multiplexer 416. The output of flip flop circuit 418 is inverted in inverter 414 and the output of inverter 414 is provided as a second input to multiplexer 416. The output of flip flop 418 is also provided as a first input to multiplexer 424 and to a data input of flip-flop circuit 420. The current clock signal is provided to a clock input of flip flop 420. The output of flip flop circuit 420 is provided as a second input to multiplexer 424 in fractional pulse generator circuit 422. Multiplexers 416 and 424 include a control input to receive a signal that selects the first input multiplexer 416 and the second input of multiplexer 424 when the fraction is less than or equal to 0.5 otherwise the second input of multiplexer 416 and the first input of multiplexer 424 is selected for output by multiplexers 416 and 424 when the fraction is greater than 0.5.

Next clock synchronization logic 435 includes flip-flop circuits 436, 438, 440, 442, and 444. The output of multiplexer 416 is provided as a data input to flip-flop circuit 436. The output of each of flip-flop circuits 436, 438, 440, 442 is provided as data input to a respective, successive one of flip flop circuits 438, 440, 442, 444. The output of flip flop circuit 444 is a clock synchronization signal CLKOB_SYNC5.

Fractional pulse generator circuit 422 produces a pulse signal CLKDIV_IN_HOLD to hold the output CLKDIV_IN steady during transitions from CLK_CUR to CLK_NEXT, and includes multiplexer 426 and NOR gate 428, as well as multiplexer 424. Multiplexer 426 includes a first input coupled to a signal with a value of logic "1", a second input coupled to a signal with a value of logic "0", and a control input coupled to a clock sync signal CLKOB_SYNC1. The output of multiplexer 426 is provided as a first input to NOR gate 428. The output of multiplexer 424 is provided to a second input of NOR gate 428, and a NO_HOLD signal is provided as a third input to NOR gate 428. NO_HOLD signal is logic high when the signals next selected fractional phase FRAC_SEL_NEXT equals the current selected fractional FRAC_SEL_CUR. The output of NOR gate 428 is provided as a first input to OR gate 434, which is referred to as pulse extension. Multiplexer 432 in current clock to next clock switching circuitry 430 includes a first input coupled to the clock next signal CLK_NEXT and a second input coupled to the current clock signal CLK_CUR. The output of multiplexer 432 is provided as a second input to OR gate 434.

Figure 5:
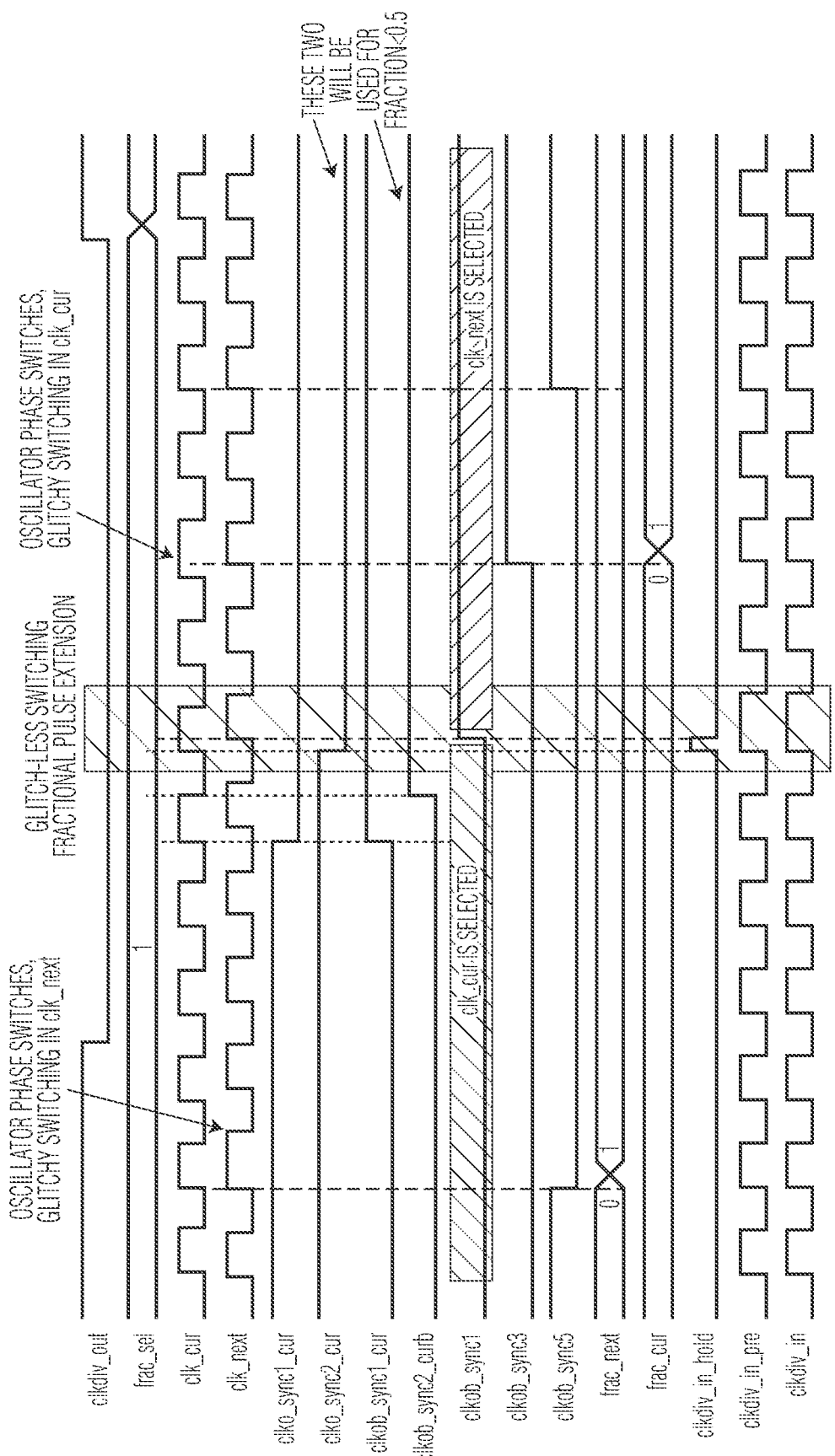
FIG. 5 illustrates time history graphs for signals in the pulse extension logic circuitry of FIG. 4 for a clock phase fraction of ⅙ in accordance with selected embodiments of the invention.

To describe the operation of multiphase divider circuit 114 with reference to FIGS. 4 and 5, FIG. 5 illustrates time history graphs for signals in pulse extension logic circuitry 316 of FIG. 4 with a clock phase fraction of ⅙ in accordance with selected embodiments of the invention. In a sequence of events, pulse extension logic circuitry 316 is triggered based on the falling edge of divided clock out signal CLKDIV_OUT. Fractional select signal FRAC_SEL switches to 1, which corresponds to a clock phase fraction of ⅙. An amount of phase shift equal to fraction of ⅙ is added to the next clock signal CLK_NEXT, so that the phase for next clock signal CLK_NEXT is shifted by a fraction of ⅙ of the total phase shift available. The current clock signal CLK_CUR is synchronized using current clock synchronization logic circuit 408, which generates clock synchronization signals CLKO_SYNC1_CUR, CLKO_SYNC2_CUR, CLKOB_SYNC1_CUR, and CLKOB_SYNC2_CURB. Since the selected fraction is less than 0.5, the first input of multiplexer 416 and the second input of multiplexer 424 are provided to next clock synchronization logic 435 and fractional pulse generator circuit 422, respectively.

The next clock signal CLK_NEXT is synchronized in next clock synchronization circuit 435 and the output of flip flop circuit 436, shown as signal CLKOB_SYNC1. Once the next clock signal CLK_NEXT is selected, the signal CLKOB_SYNC1 controls multiplexer 432 to generate the signal CLKDIV_IN_PRE from the first input of multiplexer 432, which is coupled to the next clock signal CLK_NEXT.

The fractional pulse generator circuit 422 helps prevent glitches when switching between the current and next clock signals by holding the signal CLKDIV_IN HIGH between phases using the hold signal CLKDIV_IN_HOLD, until multiplexer 432 switches. Once the pre-divided clock in signal CLKDIV_IN_PRE is set HIGH, the output of OR gate 434, shown as the clock signal CLKDIV_IN, is extended by the selected clock phase fraction. The extension in the clock signal CLKDIV_IN extends the pulse width of current phase until edge of next clock phase arrives to help smooth switching between phases.

Figure 6:
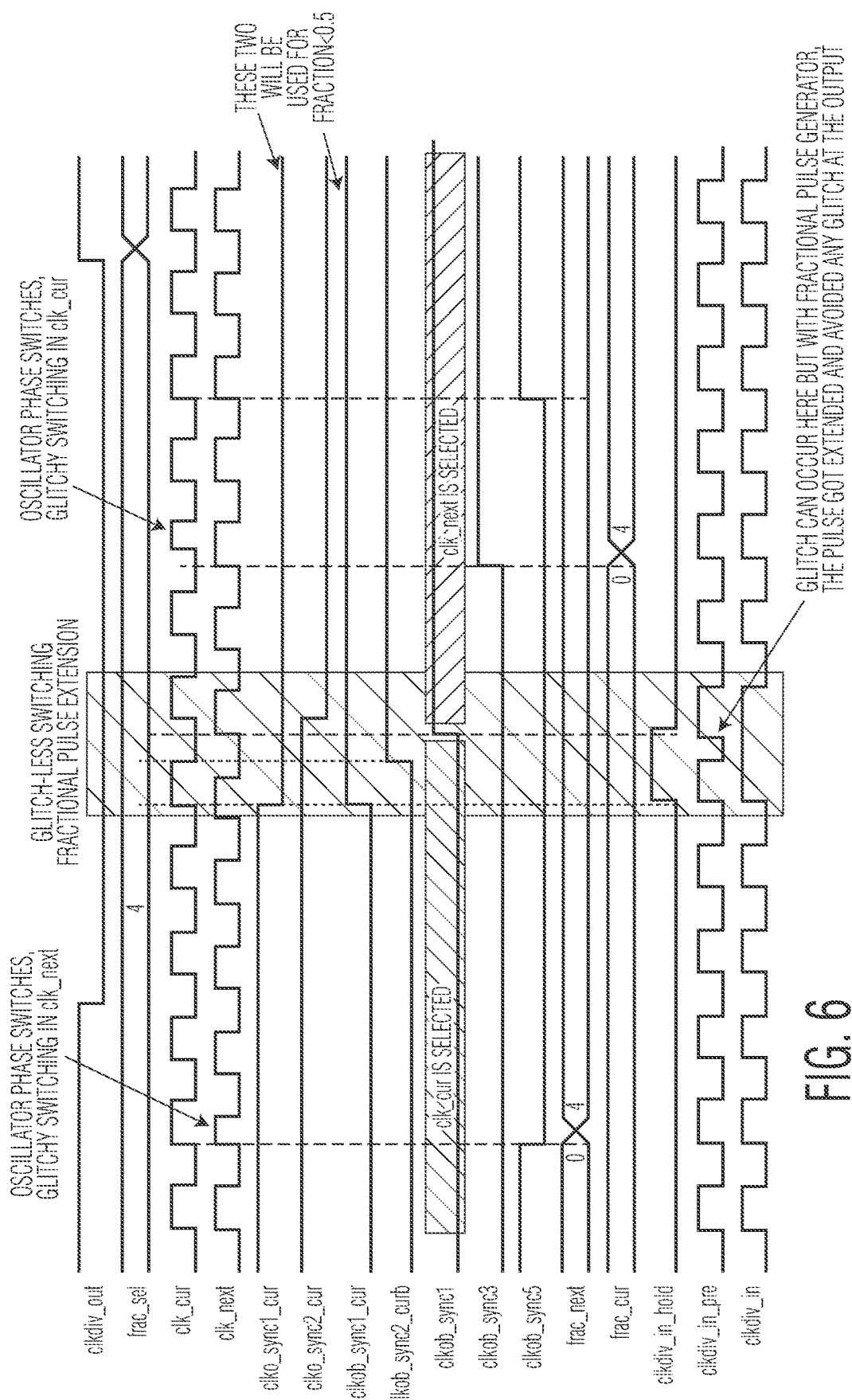
FIG. 6 illustrates time history graphs for signals in the pulse extension logic circuitry of FIG. 4 for a clock phase fraction of ⅚ in accordance with selected embodiments of the invention.

FIG. 6 illustrates time history graphs for signals in the pulse extension logic circuitry of FIG. 4 for a phase fraction of ⅝ in accordance with selected embodiments of the invention. The next fraction signal FRAC_NEXT switches from "0" to "4". CLKDIV_IN_PRE experiences a glitch while transitioning from the current clock signal CLK_CUR to next clock signal CLK_NEXT. The clock hold signal CLKDIV_IN_HOLD is asserted for an extra half clock cycle for fractions greater than 0.5, causing the clock signal CLKDIV_IN to be extended, not allowing the glitch in clock signal CLKDIV_IN_PRE to pass to clock signal CLKDIV_IN. The current fractional phase FRAC_CUR is updated to the next fractional phase FRAC_NEXT. The current clock signal CLK_CUR becomes synchronized with the next clock signal CLK_NEXT. Once the rising edge of the clock signal CLKDIV_OUT is detected, the clock signal CLKDIV_IN_PRE is switched to the current clock signal CLK_CUR in multiplexer 432 (CLKOB_SYNC1=0). The next fraction signal FRAC_NEXT is updated by the output of flip flop circuit 308. The cycle will repeat when the falling edge of the divided clock out signal CLKDIV_OUT is detected.

Note that the current clock signal CLK_CUR can switch to the next clock signal CLK_NEXT anytime during period when the divided clock out signal CLKDIV_OUT is low, after CLKDIV_IN transitions from CLK_CUR to CLK_NEXT. Similarly, the next fraction signal FRAC_NEXT can be updated during the period when the divided clock out signal CLKDIV_OUT is asserted.

By now it should be appreciated that in some embodiments, there has been provided an integrated circuit that can comprise an oscillator configured to provide a plurality of clock signals, including a first clock signal having a first period and a first frequency, wherein each clock signal has the first frequency and is phase shifted from the first clock signal by an integer times a predetermined fractional amount of the first period, wherein the predetermined fractional amount is between zero and one; a sigma-delta modulator; and a multiphase frequency divider configured to receive the plurality of clock signals and provide a divided clock output (clkdiv_out) which has a second frequency. The first frequency divided by the second frequency is capable of being an integer or a non-integer, the multiphase frequency divider can comprise an integer frequency divider configured to provide the divided clock output (clkdiv_out) based on a modified clock input (clkdiv_in), and a clock selector (300) configured to provide a current clock as the modified clock input during a first portion of the divided clock output and a next clock as the modified clock input during a subsequent portion of the divided clock output. The current clock and the next clock can be different selected clocks signals of the plurality of clock signals, and wherein the next clock is selected from the plurality of clock signals based on a selected fractional phase shift amount (frac_sel) indicated by the sigma-delta modulator.

In another aspect, the selected fractional phase shift amount can be between zero and one, and can correspond to a selected integer times the predetermined fractional amount of the first period.

In another aspect, each clock signal of the plurality of clock signals can be phase shifted from another clock signal of the plurality of clock signals by the predetermined fractional amount of the first period.

In another aspect, the oscillator can comprise a ring oscillator with N inverters, in which N is an odd number greater than or equal to three, and the plurality of clock signals includes 2*N clock signals. N can be even if the ring oscillator is differential.

In another aspect, the plurality of clock signals can be provided by outputs of the N inverters and complements of the outputs of the N inverters.

In another aspect, the predetermined fractional amount of the first period can be 1/(2*N) of the first period.

In another aspect, a transition in providing the next clock rather than the current clock as the modified clock input (e.g. when clkob_sync1 is asserted) can occur in response to a falling edge of the divided clock output.

In another aspect, the transition can occur a predetermined number of clock cycles of the current clock after the falling edge of the divided clock output (e.g. propagation through 3-4 flip flops) and is synchronized with a clock edge of the next clock.

In another aspect, after the transition but prior to a subsequent rising edge of the divided clock output, the selected clock signal for the next clock can become the selected clock signal for the current clock.

In another aspect, the selected fractional phase shift amount can be between zero and one, and can correspond to a multiple of the predetermined fractional amount of the first period. The clock selector can comprise pulse extension circuitry configured to extend a pulse of the modified clock input such that the pulse of the modified clock input during which the transition occurs begins synced with a rising edge of a pulse of the current clock and ends synced with a falling edge of a pulse of the next clock.

In another aspect, when the selected fractional shift amount (frac_sel) indicated by the sigma-delta modulator is greater than 0.5, the pulse extension circuitry can be configured to extend the pulse of the modified clock input during which the transition occurs to have a pulse width that is greater than a sum of a pulse width of the pulse of the current clock and a pulse width of the pulse of the next clock. (For example, clkdiv_in is extended to cover the sum of the pulse widths of the current and next clock so as to filter out the additional edges of clkdiv_in_pre.)

In another aspect, when the selected fractional shift amount indicated by the sigma-delta modulator is less than or equal to 0.5, the pulse extension circuitry can be configured to extend the pulse of the modified clock input during which the transition occurs to have a pulse width that is less than or equal to a sum of a pulse width of the pulse of the current clock and a pulse width of the pulse of the next clock. (For example, no additional edges of clkdiv_in_pre to filter out.)

In other embodiments, an integrated circuit can comprise a ring oscillator having N inverters, wherein N is an integer greater than or equal to three, and the ring oscillators provides 2*N clock signals, including outputs of the N inverters and complements of the outputs of the N inverters. The integrated circuit can further comprise a sigma-delta modulator, and a multiphase frequency divider configured to receive the 2*N clock signals and provide a divided clock output (clkdiv_out). The multiphase frequency divider can comprise an integer frequency divider configured to provide the divided clock output (clkdiv_out) based on a modified clock input (clkdiv_in), a clock selector (300) configured to provide a current clock as the modified clock input during a first portion of the divided clock output and a next clock as the modified clock input during a subsequent portion of the divided clock output. The current clock and the next clock can be different clocks signals of the 2*N clock signals, and the next clock can be selected from the 2*N clock signals based on a fractional phase shift amount (frac_sel) indicated by the sigma-delta modulator. The fractional phase shift amount can be between zero and one and is a fraction of a period of a first clock signal (e.g. ⅙, ⅖, etc.) of the 2*N clock signals.

In another aspect, the fractional phase shift amount can be a multiple of 1/(2*N) of the period.

In another aspect, a transition from provided the current clock as the modified clock input to providing the next clock as the modified clock input (e.g. when clkob_sync1 is asserted) can occur in response to a falling edge of the divided clock output.

In another aspect, the transition can occur a predetermined number of clock cycles of the current clock after the falling edge of the divided clock output (e.g. propagation through 3-4 flip flops) and can be synchronized with a clock edge of the next clock.

In another aspect, after the transition but prior to a subsequent rising edge of the divided clock output, the selected clock signal for the next clock can become the selected clock signal for the current clock.

In another aspect, the clock selector can comprise pulse extension circuitry configured to extend a pulse of the modified clock input such that the pulse of the modified clock input during which the transition occurs begins synced with a rising edge of a pulse of the current clock and ends synced with a falling edge of a pulse of the next clock.

In another aspect, when the selected fractional shift amount (frac_sel) indicated by the sigma-delta modulator is greater than 0.5, the pulse extension circuitry can be configured to extend the pulse of the modified clock input during which the transition occurs to have a pulse width that is greater than a sum of a pulse width of the pulse of the current clock and a pulse width of the pulse of the next clock, (e.g. clkdiv_in is extended to cover the sum of the pulse widths of the current and next clock so as to filter out the additional edges of clkdiv_in_pre), and when the selected fractional shift amount indicated by the sigma-delta modulator is less than or equal to 0.5, the pulse extension circuitry can be configured to extend the pulse of the modified clock input during which the transition occurs to have a pulse width that is less than or equal to a sum of a pulse width of the pulse of the current clock and a pulse width of the pulse of the next clock (e.g., no additional edges of clkdiv_in_pre to filter out).

In another aspect, N can be an odd integer if the ring oscillator used single-ended signals. N can be even if the ring oscillator uses differential signal.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments selected instructions/steps can be implemented as functional and software instructions. In other embodiments, selected functions and instructions can be implemented either using logic gates, data storage (memory), application specific chips, firmware, as well as other hardware forms.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   an oscillator configured to provide a plurality of clock signals, including a first clock signal having a first period and a first frequency, wherein each clock signal has the first frequency and is phase shifted from the first clock signal by an integer times a predetermined fractional amount of the first period, wherein the predetermined fractional amount is between zero and one;
   a sigma-delta modulator; and
   a multiphase frequency divider configured to receive the plurality of clock signals and provide a divided clock output which has a second frequency, wherein the first frequency divided by the second frequency is capable of being an integer or a non-integer, the multiphase frequency divider comprising:
   an integer frequency divider configured to provide the divided clock output based on a modified clock input;
   a clock selector configured to provide a current clock as the modified clock input during a first portion of the divided clock output and a next clock as the modified clock input during a subsequent portion of the divided clock output, wherein:
   the current clock and the next clock are different selected clocks signals of the plurality of clock signals,
   the next clock is selected from the plurality of clock signals based on a selected fractional phase shift amount indicated by the sigma-delta modulator,
   a transition in providing the next clock rather than the current clock as the modified clock input occurs in response to a falling edge of the divided clock output,
   the selected fractional phase shift amount is between zero and one and corresponds to a multiple of the predetermined fractional amount of the first period, and
   the clock selector comprises pulse extension circuitry configured to extend a pulse of the modified clock input such that the pulse of the modified clock input during which the transition occurs begins synced with a rising edge of a pulse of the current clock and ends synced with a falling edge of a pulse of the next clock.

2. The integrated circuit of claim 1, wherein the selected fractional phase shift amount corresponds to a selected integer times the predetermined fractional amount of the first period.

3. The integrated circuit of claim 1, wherein each clock signal of the plurality of clock signals is phase shifted from another clock signal of the plurality of clock signals by the predetermined fractional amount of the first period.

4. The integrated circuit of claim 1, wherein the oscillator comprises a ring oscillator with N inverters, in which N is a number greater than or equal to three, and the plurality of clock signals includes 2*N clock signals.

5. The integrated circuit of claim 4, wherein the plurality of clock signals are provided by outputs of the N inverters and complements of the outputs of the N inverters.

6. The integrated circuit of claim 4, wherein the predetermined fractional amount of the first period is 1/(2*N) of the first period.

7. The integrated circuit of claim 1, wherein the transition occurs a predetermined number of clock cycles of the current clock after the falling edge of the divided clock output and is synchronized with a clock edge of the next clock.

8. The integrated circuit of claim 7, wherein, after the transition but prior to a subsequent rising edge of the divided clock output, the selected clock signal for the next clock becomes the selected clock signal for the current clock.

9. The integrated circuit of claim 1, wherein:
   in response to the selected fractional shift amount indicated by the sigma-delta modulator being greater than 0.5, the pulse extension circuitry is configured to extend the pulse of the modified clock input during which the transition occurs to have a pulse width that is greater than a sum of a pulse width of the pulse of the current clock and a pulse width of the pulse of the next clock.

10. The integrated circuit of claim 9, wherein:
    in response to the selected fractional shift amount indicated by the sigma-delta modulator being less than or equal to 0.5, the pulse extension circuitry is configured to extend the pulse of the modified clock input during which the transition occurs to have a pulse width that is less than or equal to a sum of a pulse width of the pulse of the current clock and a pulse width of the pulse of the next clock.

11. An integrated circuit comprising:
a ring oscillator having N inverters, wherein N is an integer greater than or equal to three, wherein the ring oscillators provides 2*N clock signals, including outputs of the N inverters and complements of the outputs of the N inverters;
a sigma-delta modulator; and
a multiphase frequency divider configured to receive the 2*N clock signals and provide a divided clock output, the multiphase frequency divider comprising:
an integer frequency divider configured to provide the divided clock output based on a modified clock input;
a clock selector configured to provide a current clock as the modified clock input during a first portion of the divided clock output and a next clock as the modified clock input during a subsequent portion of the divided clock output, wherein:
the current clock and the next clock are different clocks signals of the 2*N clock signals,
the next clock is selected from the 2*N clock signals based on a fractional phase shift amount indicated by the sigma-delta modulator, wherein
the fractional phase shift amount is between zero and one and is a fraction of a period of a first clock signal of the 2*N clock signals,
a transition from providing the current clock as the modified clock input to providing the next clock as the modified clock input occurs in response to a falling edge of the divided clock output, and
the clock selector comprises pulse extension circuitry configured to extend a pulse of the modified clock input such that the pulse of the modified clock input during which the transition occurs begins synced with a rising edge of a pulse of the current clock and ends synced with a falling edge of a pulse of the next clock.

12. The integrated circuit of claim 11, wherein the fractional phase shift amount is a multiple of 1/(2*N) of the period.

13. The integrated circuit of claim 11, wherein the transition occurs a predetermined number of clock cycles of the current clock after the falling edge of the divided clock output and is synchronized with a clock edge of the next clock.

14. The integrated circuit of claim 13, wherein, after the transition but prior to a subsequent rising edge of the divided clock output, the selected clock signal for the next clock becomes the selected clock signal for the current clock.

15. The integrated circuit of claim 11, wherein:
in response to the selected fractional shift amount indicated by the sigma-delta modulator being greater than 0.5, the pulse extension circuitry is configured to extend the pulse of the modified clock input during which the transition occurs to have a pulse width that is greater than a sum of a pulse width of the pulse of the current clock and a pulse width of the pulse of the next clock; and
in response to the selected fractional shift amount indicated by the sigma-delta modulator being less than or equal to 0.5, the pulse extension circuitry is configured to extend the pulse of the modified clock input during which the transition occurs to have a pulse width that is less than or equal to a sum of a pulse width of the pulse of the current clock and a pulse width of the pulse of the next clock.

16. The integrated circuit of claim 11, where N is an odd integer.

* * * * *